(12) United States Patent
Kubota

(10) Patent No.: US 10,141,487 B1
(45) Date of Patent: Nov. 27, 2018

(54) COVER FOR LIGHT EMITTER

(71) Applicant: SHINKO ELECTRIC INDUSTRIES CO., LTD., Nagano (JP)

(72) Inventor: Makoto Kubota, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/980,907

(22) Filed: May 16, 2018

(30) Foreign Application Priority Data

May 26, 2017 (JP) ................. 2017-104714

(51) Int. Cl.
*H01L 33/56* (2010.01)
*H01L 33/54* (2010.01)

(52) U.S. Cl.
CPC .............. *H01L 33/56* (2013.01); *H01L 33/54* (2013.01)

(58) Field of Classification Search
CPC ......... H01L 33/56; H01L 33/54; H01L 33/52; F21V 3/00; F21V 3/02; F21V 3/04; F21V 3/061; F21V 3/06
See application file for complete search history.

(56) References Cited

U.S. PATENT DOCUMENTS

| 2003/0006003 A1* | 1/2003 | Matsuoka | G02F 1/1339 |
| | | | 156/272.2 |
| 2003/0076459 A1* | 4/2003 | Murade | G02F 1/133512 |
| | | | 349/111 |
| 2004/0104674 A1* | 6/2004 | Yoo | H01J 9/261 |
| | | | 313/512 |
| 2005/0140913 A1* | 6/2005 | Yokota | H01J 5/24 |
| | | | 349/153 |
| 2005/0224827 A1 | 10/2005 | Mund et al. | |

FOREIGN PATENT DOCUMENTS

| EP | 3038173 | 6/2016 |
| JP | 2006-156528 | 6/2006 |

OTHER PUBLICATIONS

Extended European Search Report dated Sep. 26, 2018 issued with respect to the corresponding European Patent Application No. 18173164.7.

* cited by examiner

*Primary Examiner* — Anne M Hines
(74) *Attorney, Agent, or Firm* — IPUSA, PLLC

(57) ABSTRACT

A cover for a light emitter having one or more light emitting devices includes a glass plate, a frame made of metal having an opening smaller than the glass plate, and a low melting glass having a lower melting point than the glass plate, the glass plate being sealed to the frame with the low melting glass to close the opening, wherein the frame has an encircling step, and the encircling step includes a placement face situated at a recessed position relative to an upper surface of the frame and a wall face, wherein the wall face includes first wall faces situated at opposite ends of each inner side of the encircling step and a second wall face situated between the first wall faces, and the second wall face includes a face extending at a smaller inclination angle than the first wall faces with respect to the placement face.

8 Claims, 17 Drawing Sheets

COVER FOR LIGHT EMITTER

CROSS-REFERENCE TO RELATED APPLICATIONS

The present application is based upon and claims the benefit of priority from the prior Japanese Patent Application No. 2017-104714 filed on May 26, 2017, with the Japanese Patent Office, the entire contents of which are incorporated herein by reference.

FIELD

The disclosures herein relate to a cover for a light emitter.

BACKGROUND

A light emitter having one or more light emitting devices such as laser diodes is known in the art. When the airtightness of a light emitter matters, a light emitter cover having a glass plate sealed to a frame via low melting glass is mounted to a case in which one or more light emitting devices are placed, for example.

With the advancement of technology, heat quantity generated by a light emitting device increases, which makes it necessary to bond the glass plate and the frame together more firmly than ever for a light emitter cover. For the purpose of firm bonding, there is a need to fill a gap, with low melting glass, between the peripheral side surface of a glass plate and the inner wall face of a frame so that the low melting glass wets the entire peripheral side surface of the glass plate.

For example, there is a method of filling a gap with low melting glass by applying low melting glass in paste form to the gap between the peripheral side surface of a glass plate and the inner sidewall of a frame, followed by curing the paste.

The method of applying low melting glass described above needs a large quantity of low melting glass in order to wet the entire peripheral side surface of a glass plate. As a result, the size of a light emitter cover increases, giving rise to the problem of an increase in the size of the light emitter. Reducing the quantity of low melting glass to facilitate size reduction results in a failure to wet the entire peripheral side surface of a glass plate with low melting glass. This causes the problem of a lowered sealing reliability between the glass plate and the frame.
[Related-Art Documents]
[Patent Document]
[Patent Document 1] Japanese Patent Application Publication No. 2006-156528

SUMMARY

According to an aspect of the embodiment, a cover for a light emitter having one or more light emitting devices includes a glass plate having an upper face, a lower face, and a peripheral side surface, a frame made of metal having an opening smaller than the glass plate, and a low melting glass having a lower melting point than the glass plate, the glass plate being sealed to the frame with the low melting glass to close the opening, wherein the frame has an encircling step formed on a side thereof to which the glass plate is sealed, wherein the encircling step includes a placement face situated at a recessed position relative to an upper surface of the frame, the placement face being in contact with a perimeter of the lower face of the glass plate to have the glass plate placed thereon, and a wall face connecting the upper surface of the frame and the placement face, wherein the wall face includes first wall faces situated at opposite ends of each inner side of the encircling step and a second wall face situated between the first wall faces, and the second wall face includes a face extending at a smaller inclination angle than the first wall faces with respect to the placement face, and wherein gaps between the first wall faces and the peripheral side surface of the glass plate and a gap between the second wall face and the peripheral side surface of the glass plate are filled with the low melting glass.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Figure 1A:
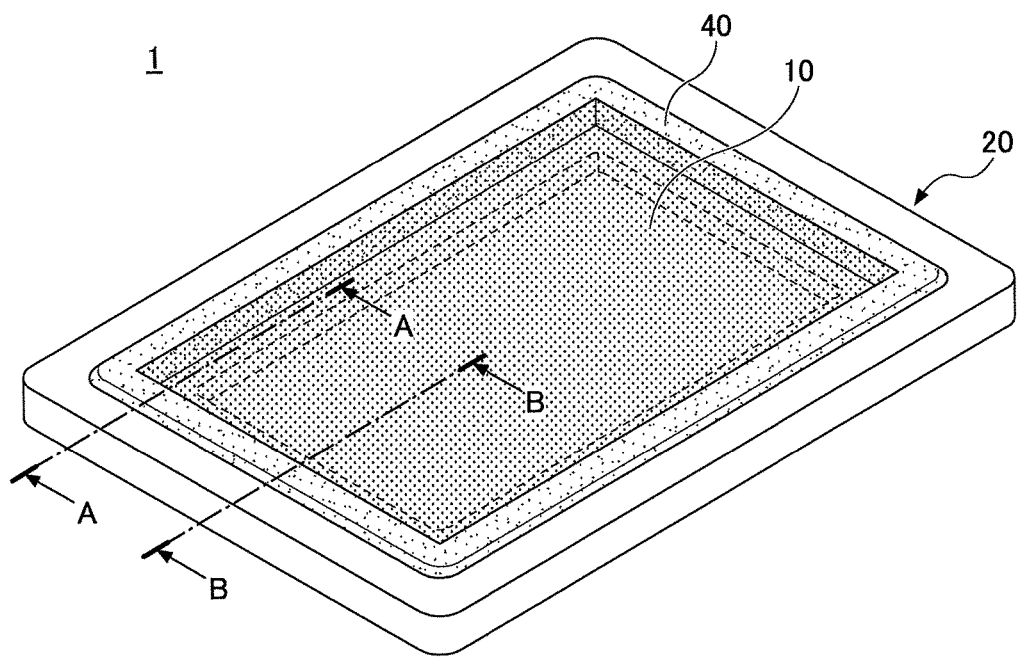
FIGS. 1A through 1C are drawings illustrating an example of a light emitter cover according to a first embodiment.
Figure 1B:
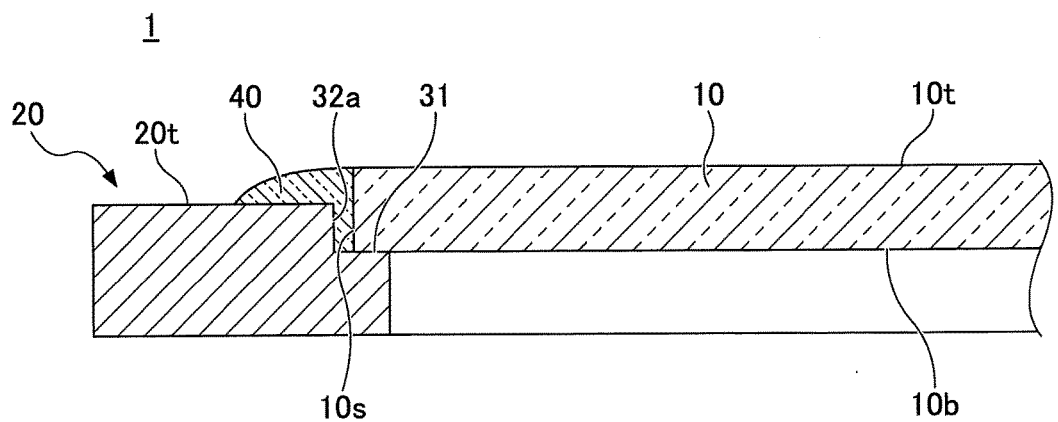
Figure 1C:
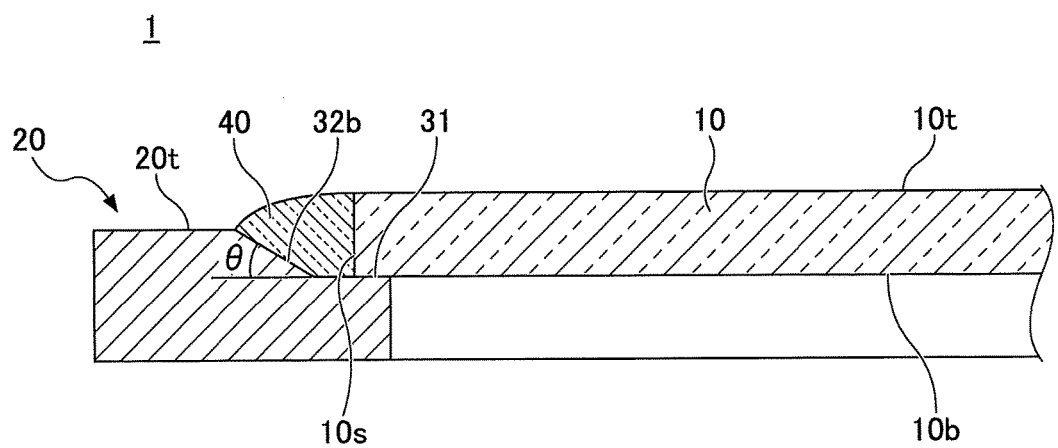

FIGS. 1A through 1C are drawings illustrating an example of a light emitter cover according to the first embodiment. FIG. 1A is an axonometric view. FIG. 1B is a partial cross-sectional view taken along a line A-A in FIG. 1A. FIG. 1C is a partial cross-sectional view taken along a line B-B in FIG. 1A.

Referring to FIGS. 1A through 1C, a light emitter cover 1 includes a glass plate 10, a frame 20, and low melting glass 40. The glass plate 10 is sealed to the frame 20 via the low melting glass 40 such as to close an opening 20x (see FIG. 3) of the frame 20. The light emitter cover 1, which is used as a cover for a light emitter having one or more light emitting devices such as laser diodes or photo diodes, serves as a member for hermetically sealing the light emitting devices inside the light emitter.

Figure 2:
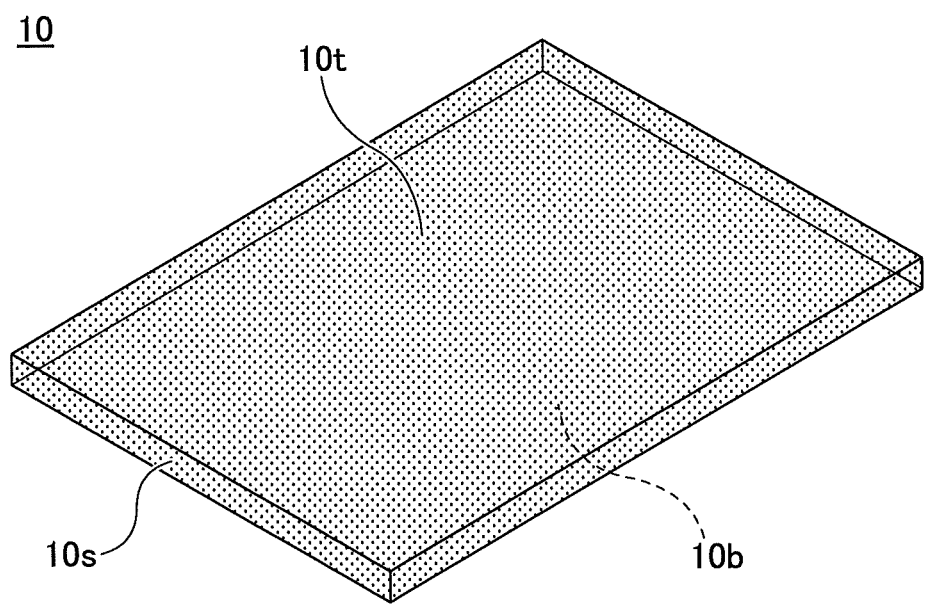
FIG. 2 is an axonometric view illustrating an example of the glass plate of the light emitter cover according to the first embodiment.

FIG. 2 is an axonometric view illustrating an example of the glass plate of the light emitter cover according to the first embodiment. As illustrated in FIG. 2, the glass plate 10 is a rectangular shape, having an upper face 10t, a lower face 10b, and a peripheral side surface 10s. The glass plate 10 is formed in conformity to the specification of the frame 20. Although the size is not limited to particular dimensions, the glass plate 10 may be approximately 20-mm long, 30-mm wide, and 1-mm thick, for example.

Borosilicate glass may be used as the glass plate 10. When the light emitter cover 1 is used as the cover for a package in which light emitting devices are placed, the glass plate 10 serves as a window which allows the passage of light emitted from the light emitting devices. For this purpose, transmissivity for the wavelengths of the light emitting devices is designed to be greater or equal to a predetermined value (e.g., 99%). The upper face 10t and the lower face 10b of the glass plate 10 may have an antireflection film formed thereon.

Figure 3A:
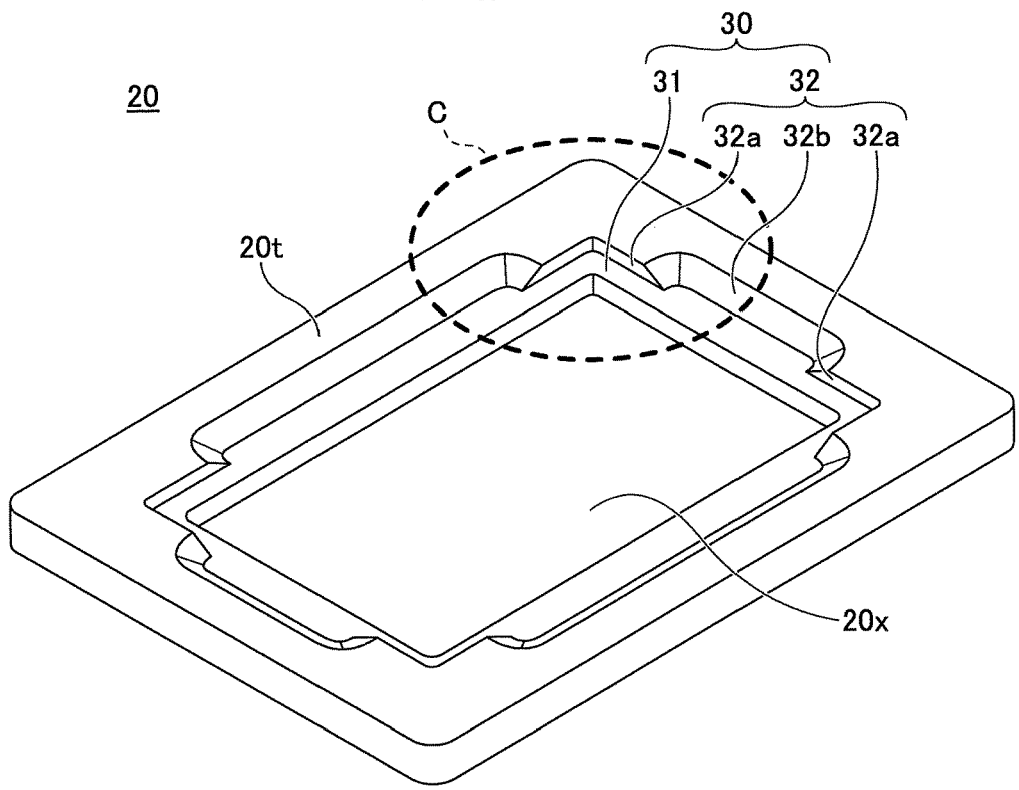
FIGS. 3A and 3B are axonometric views illustrating an example of the frame of the light emitter cover according to the first embodiment.
Figure 3B:
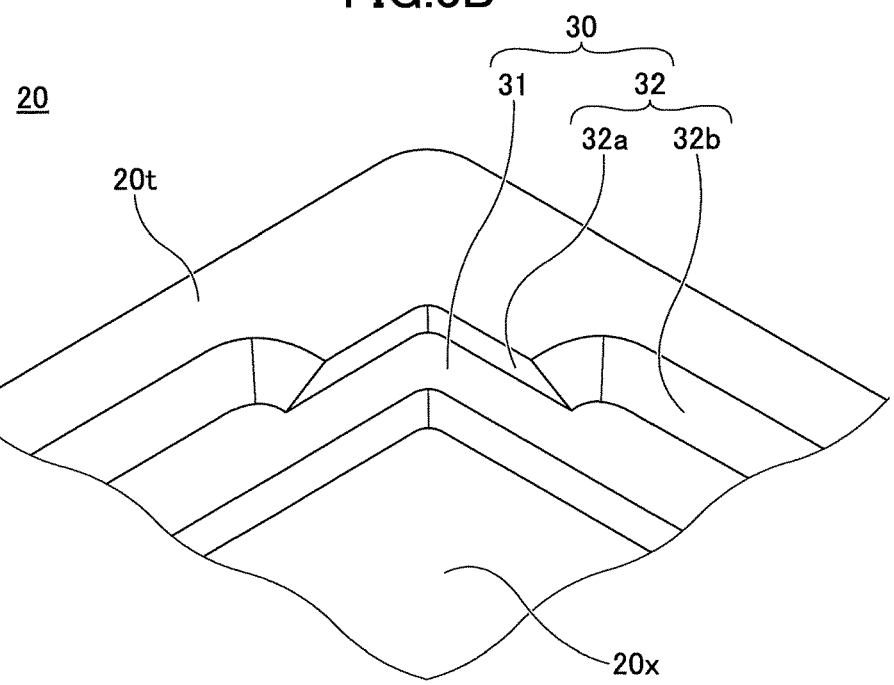

FIGS. 3A and 3B are axonometric views illustrating an example of the frame of the light emitter cover according to the first embodiment. FIG. 3A illustrates the whole view, and FIG. 3B illustrates a partial enlarged view of a portion C illustrated in FIG. 3A. As is illustrated in FIGS. 3A and 3B, the frame 20 is, a metal member having the opening 20x smaller than the glass plate 10, and may be a picture frame shape, for example. The metal that forms the frame 20 may be an alloy of nickel and iron, for example. The surface of the frame 20 may have a surface treatment, such as plating, applied thereto.

The frame 20 has an encircling (i.e., ring-shaped) step 30 formed on the side toward the opening 20x. The step 30 includes a placement face 31 and wall faces 32. The placement face 31 extends substantially parallel to an upper face 20t of the frame 20 at a recessed position relative to (i.e., at a lower vertical position than) the upper face 20t of the frame 20. The placement face 31 comes in contact with the lower face 10b of the glass plate 10 so as to provide support for the glass plate 10. The placement face 31 suffices as long as some portions thereof extend substantially parallel to the upper face of the frame 20, and may have a portion that is not parallel to the upper face of the frame 20. The expression "extending substantially parallel to the upper face of the frame 20" refers to the fact that the face is substantially parallel to the upper face of the frame 20 to the extent that the placement of the glass plate 10 is not impaired.

The wall faces 32 are portions connecting the placement face 31 to the upper face 20t of the frame 20. The wall faces 32 include first wall faces 32a situated near the opposite ends of each of the four inner sides of the encircling step 30, and include a second wall face 32b situated between the first wall faces 32a. The term "the four inner sides of the encircling step 30" refers to the four sides forming the perimeter of the opening 20x when viewed in the direction perpendicular to the upper face 20t of the frame 20.

The first wall faces 32a extend perpendicularly to the placement face 31 for the purpose of aligning the glass plate 10. This "perpendicular" condition does not require an exact right angle, and only requires that the faces are perpendicular to the placement face 31 to the extent that the alignment of the glass plate 10 is not impaired. This definition of the condition will hereinafter be applicable in similar situations. A minute gap (i.e., clearance) is formed between the first wall faces 32a and the peripheral side surface 10s of the glass plate 10. The gap between the first wall faces 32a and the peripheral side surface 10s of the glass plate 10 may be approximately 100 micrometers, for example.

The second wall face 32b has an inclination angle θ (see FIG. 10) that is less steep than the first wall faces 32a. The second wall face 32b is tilted with respect to the placement face 31 such that the distance between the second wall face 32b and the peripheral side surface 10s of the glass plate 10 increases toward the upper face 20t of the frame 20. The inclination angle θ is set greater than or equal to the minimum angle at which the melted mass of the low melting glass 40 starts sliding on its own weight. The inclination angle θ may be approximately 30 to 60 degrees, for example.

The second wall face 32b preferably extend the same distance toward the opposite ends from the center (i.e., a midpoint between the opposite ends) of each inner side of the step 30, for example. On each inner side of the step 30, the ratio of the length of the first wall faces 32a to the length of the second wall face 32b along the inner side is preferably about 1:1 to 1:9. These conditions serve to reliably seal the glass plate 10 to the frame 20.

By referring to FIGS. 1A through 10 again, the low melting glass 40, which is a member for sealing the glass plate 10 to the frame 20, is made of a material having a lower melting point than the glass plate 10. Low melting glass containing bismuth as a main component without containing lead or low melting glass containing vanadium without containing lead may be used as the low melting glass 40, for example.

The gap between the first wall faces 32a and the peripheral side surface 10s of the glass plate 10 and the gap between the second wall face 32b and the peripheral side surface 10s of the glass plate 10 are filled with the low melting glass 40. The upper face 10t of the glass plate 10 is situated above the upper face 20t of the frame 20. The low melting glass 40 covers the portion of the peripheral side surface 10s of the glass plate 10 that is situated above the upper face 20t of the frame 20. Namely, the entire peripheral side surface 10s of the glass plate 10 is in contact with the low melting glass 40 (i.e., wetted by the low melting glass 40). The low melting glass 40 may flow into between the placement face 31 and the perimeter of the lower face 10b of the glass plate 10.

Figure 4A:
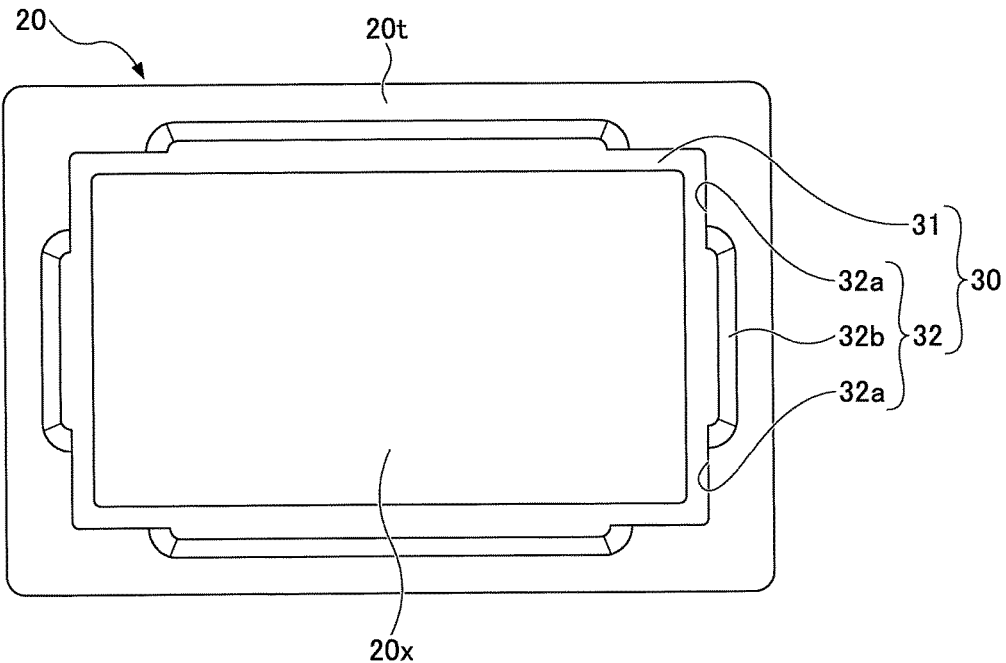
FIGS. 4A and 4B are drawings illustrating a method of sealing the glass plate to the frame with low melting glass.

In the following, a description will be given of the method of sealing the glass plate 10 to the frame 20 with the low melting glass 40. FIGS. 4A and 4B to FIGS. 7A through 7C are drawings illustrating the method of sealing the glass plate to the frame with the low melting glass. As illustrated in FIG. 4A, the frame 20 having the opening 20x and the step 30 is prepared. The frame 20 may be made by a stamping process using a metal material such as an alloy of nickel and iron, for example. The surface of the frame 20 may have a surface treatment such as plating applied thereto after the stamping process.

Figure 4B:
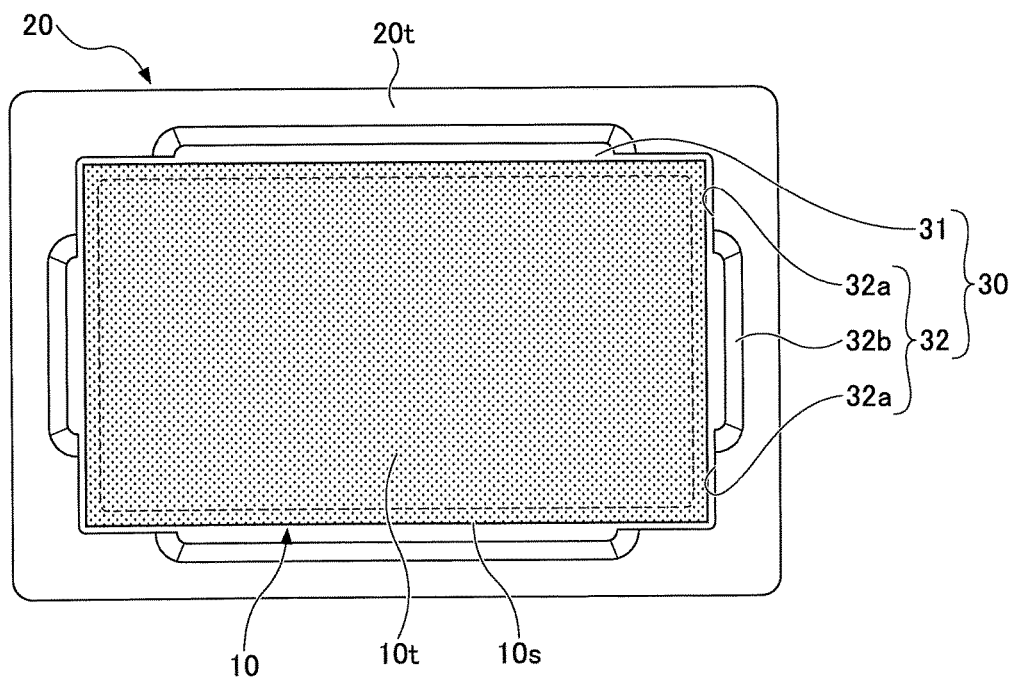

As illustrated in FIG. 4B, the glass plate having a rectangular shape is cut from a large size glass plate made of borosilicate glass or the like, for example. The glass plate 10 is placed in the opening 20x of the frame 20 such that the perimeter of the lower face 10b (see FIG. 2, for example) of the glass plate 10 comes in contact with the placement face 31. The upper face 10*t* and the lower face 10*b* of the glass plate 10 may have an antireflection film formed thereon.

Subsequently, as illustrated in an upper part of FIG. 5, for example, low melting glass particles 40*a* are formed into a picture frame shape, followed by being sintered at a predetermined temperature to create a low melting glass 40*b* illustrated in a lower part of FIG. 5. The sintered low melting glass 40*b* contracts relative to the shape of the low melting glass particles 40*a*, with the center area of each inner side and each outer side bulging outwardly. For the sake of convenience of explanation, the low melting glass particles 40*a*, the sintered low melting glass 40*b*, and the sealed low melting glass 40 are denoted with respective reference numerals.

Figure 6A:
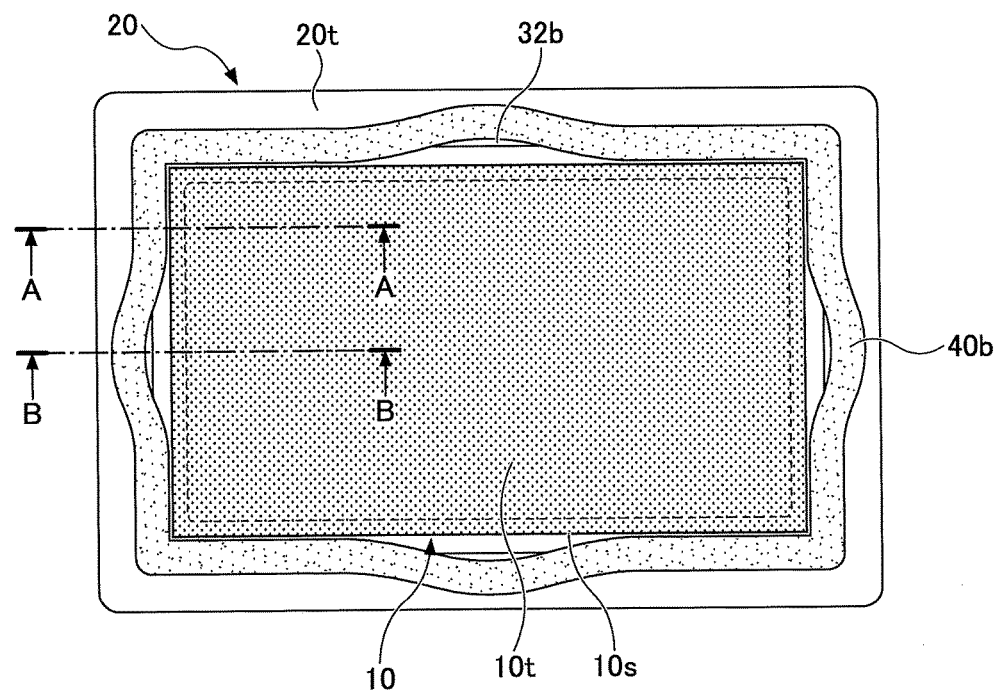
FIGS. 6A through 6C are drawings illustrating the method of sealing the glass plate to the frame with low melting glass.
Figure 6B:
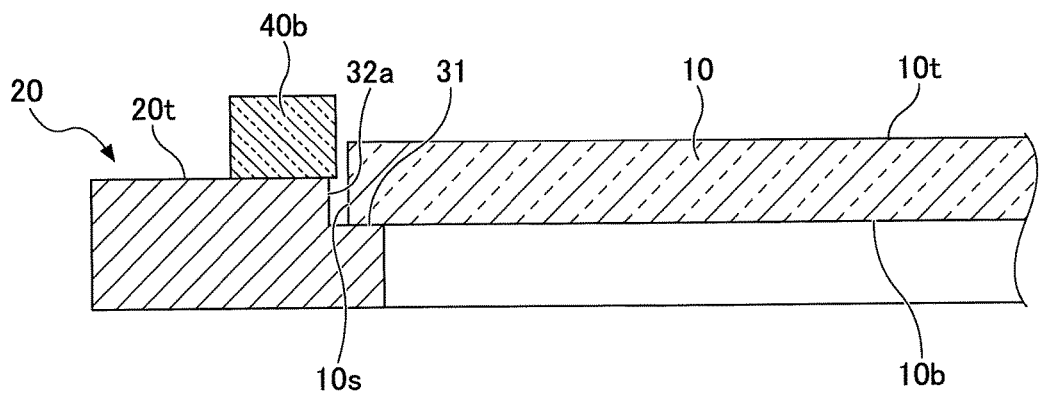
Figure 6C:
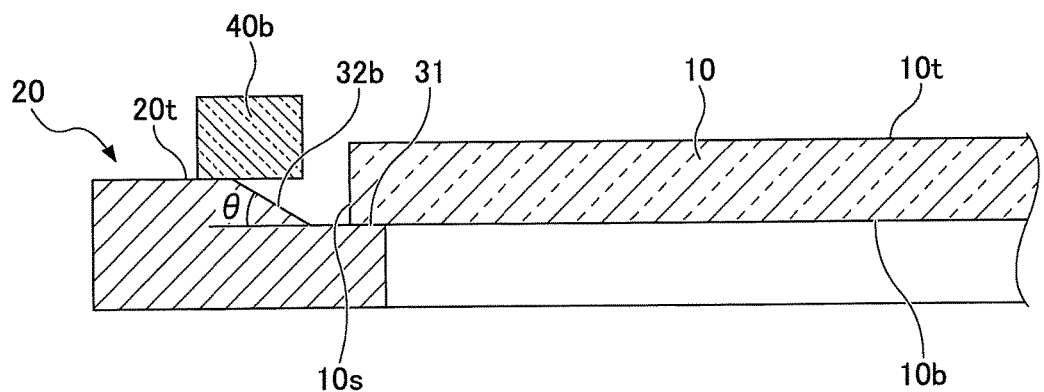

As illustrated in FIGS. 6A through 6C, the low melting glass 40*b* is placed on the frame 20 having the glass plate 10 seated thereon (see FIG. 4B). FIG. 6A is a plan view. FIG. 6B is a partial cross-sectional view taken along a line A-A in FIG. 6A. FIG. 6C is a partial cross-sectional view taken along a line B-B in FIG. 6A. Each inner side and each outer side of the low melting glass 40*b* has an outwardly bulging center area, so that a gap between the low melting glass 40*b* and the peripheral side surface 10*s* of the glass plate 10 increases around the center area of each inner side and each outer side.

Figure 7A:
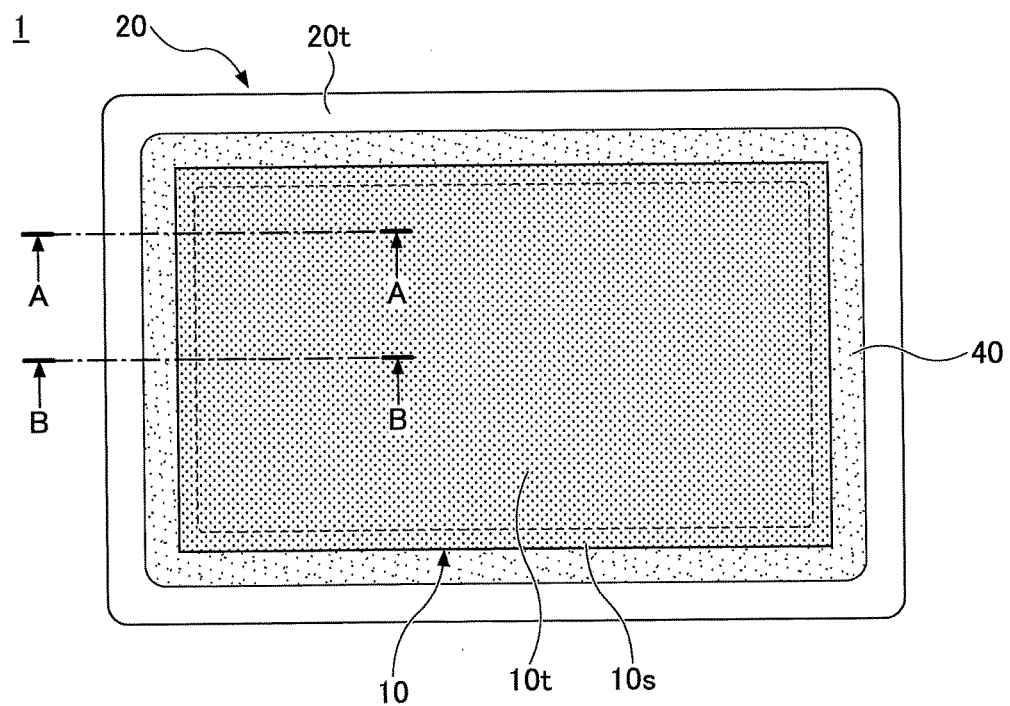
FIGS. 7A through 7C are drawings illustrating the method of sealing the glass plate to the frame with low melting glass.
Figure 7B:
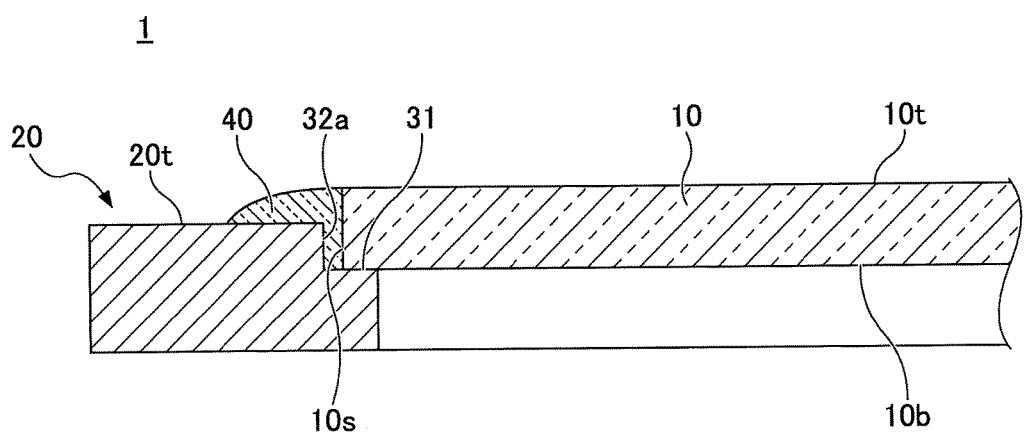
Figure 7C:
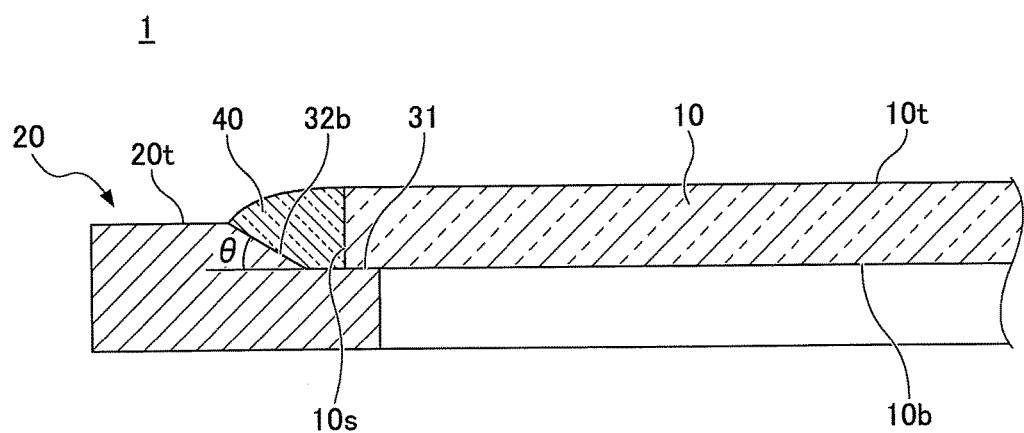

As illustrated in FIGS. 7A through 7C, the low melting glass 40*b* is melted at or above a predetermined temperature and then cured, so that the glass plate 10 is sealed to the frame 20. The cured glass is referred to as the low melting glass 40. With this, the light emitter cover 1 is completed in final form. FIG. 7A is a plan view. FIG. 7B is a partial cross-sectional view taken along a line A-A in FIG. 7A. FIG. 7C is a partial cross-sectional view taken along a line B-B in FIG. 7A.

In the following, the characteristic advantages of the light emitter cover 1 will be described by referring to a comparative example. FIGS. 8A and 8B through FIGS. 10A through 10O are drawings illustrating a method of sealing a frame according to a comparative example.

Figure 8A:
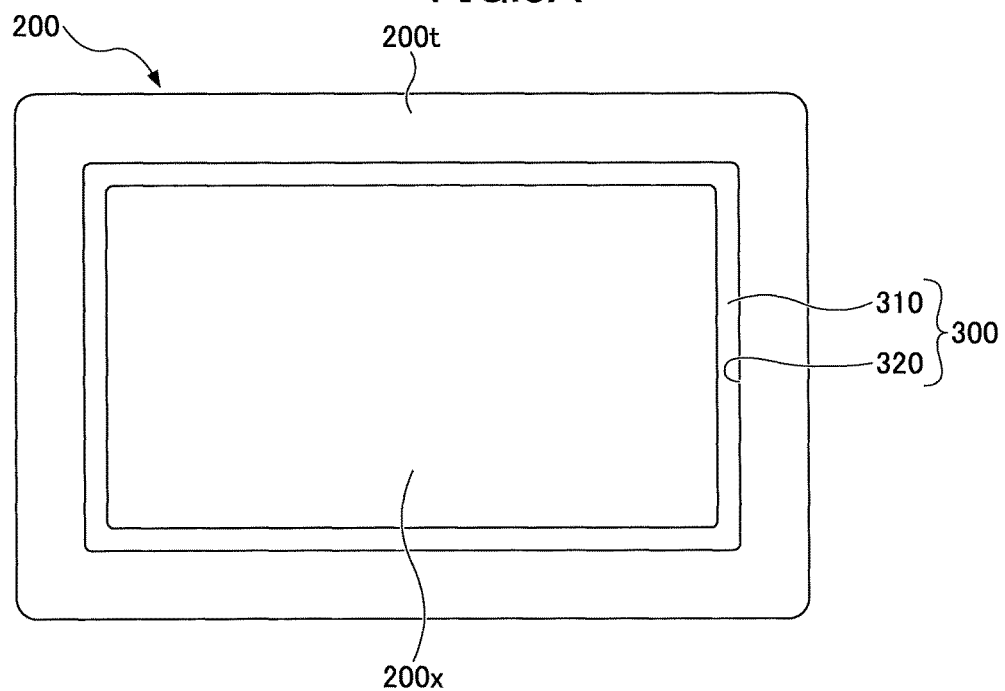
FIGS. 8A and 8B are drawings illustrating a method of sealing a frame according to a comparative example.

As illustrated in FIG. 8A, a frame 200 having an opening 200*x* is prepared. The frame 200 has an encircling (i.e., ring-shaped) step 300 formed on the side toward the opening 200*x*. The step 300 includes a placement face 310 and wall faces 320. The placement face 310 extends substantially parallel to an upper face 200*t* of the frame 200 at a recessed position relative to (i.e., at a lower vertical position than) the upper face 200*t* of the frame 200. The placement face 31 comes in contact with the lower face 10*b* of the glass plate 10 so as to provide support for the glass plate 10. The wall faces 320 are portions connecting the placement face 310 to the upper face 200*t* of the frame 200. The entirety of the wall faces 320 extends perpendicularly to the placement face 310. There is no inclined face corresponding to the second wall face 32*b* of the frame 20.

Figure 8B:
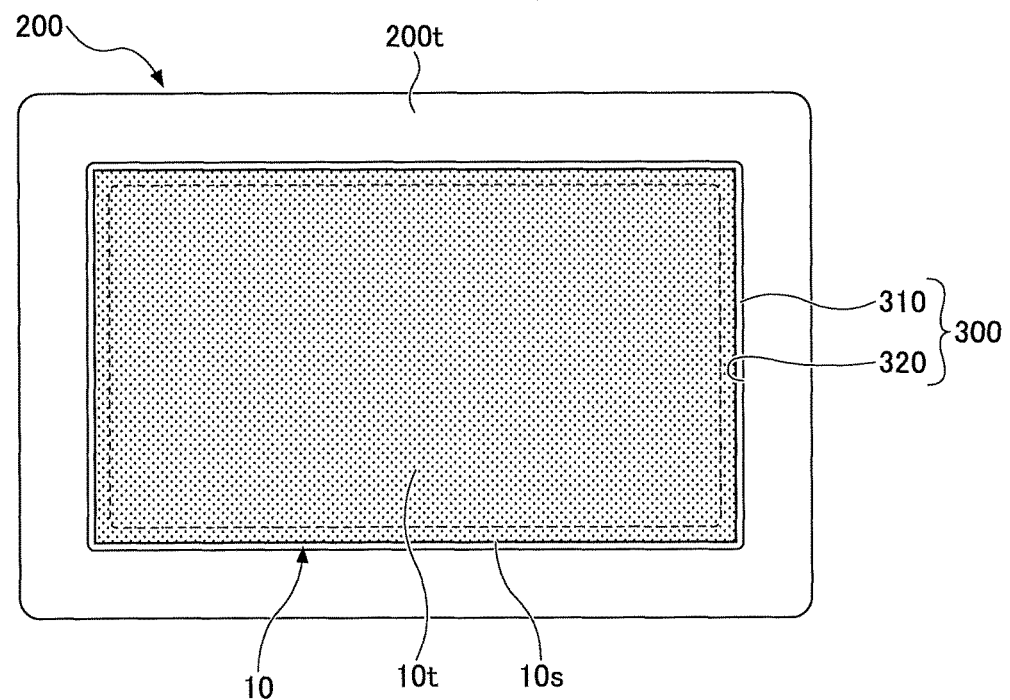

As illustrated in FIG. 8B, the same rectangular-shaped glass plate 10 as the one shown in FIG. 4B is prepared, and is placed in the opening 200*x* of the frame 200 such that the perimeter of the lower face 10*b* of the glass plate 10 (see FIG. 2) comes in contact with the placement face 310.

Figure 5:
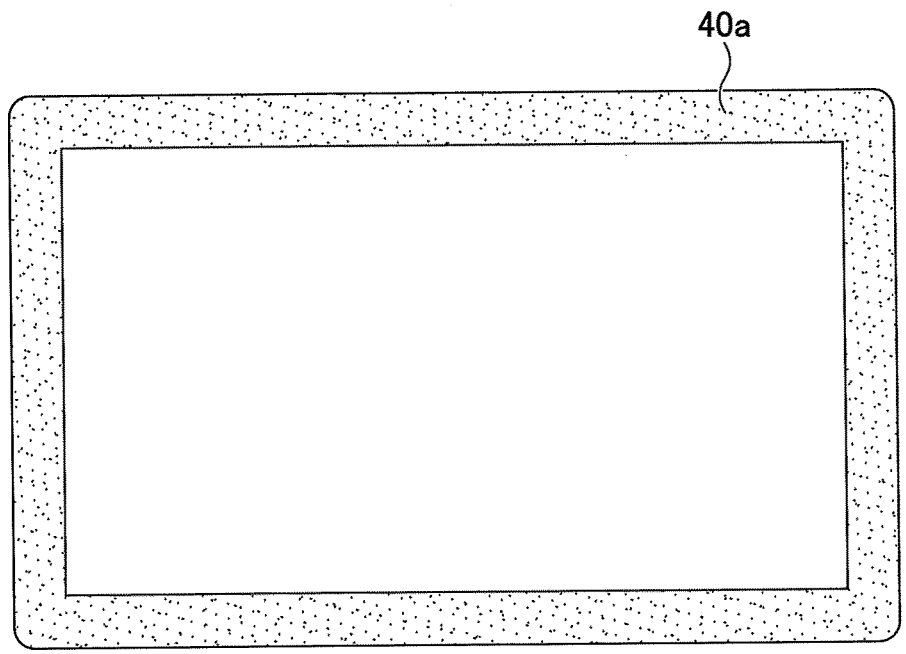
FIG. 5 is a drawing illustrating the method of sealing the glass plate to the frame with low melting glass.
Figure 5:
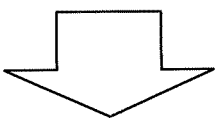
Figure 5:
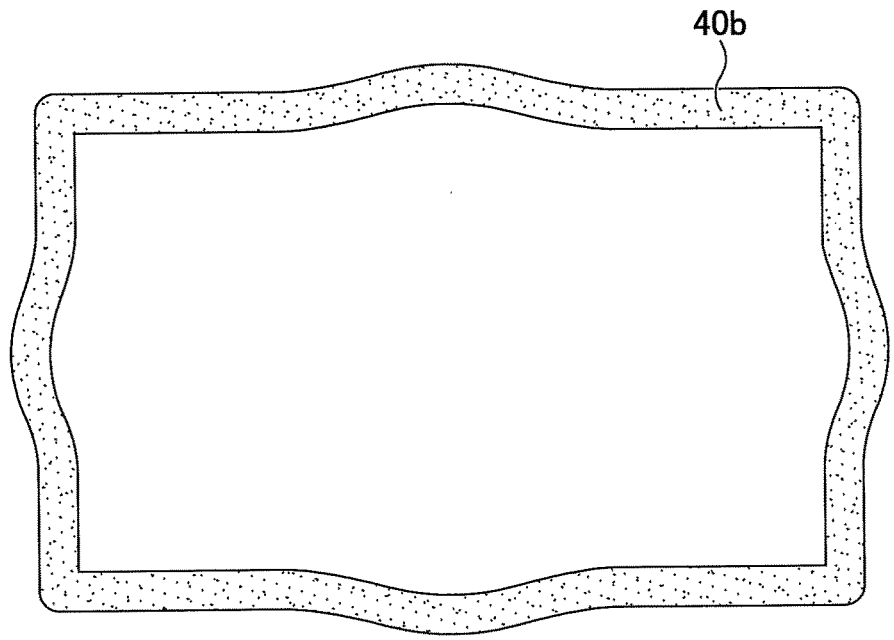
Figure 9A:
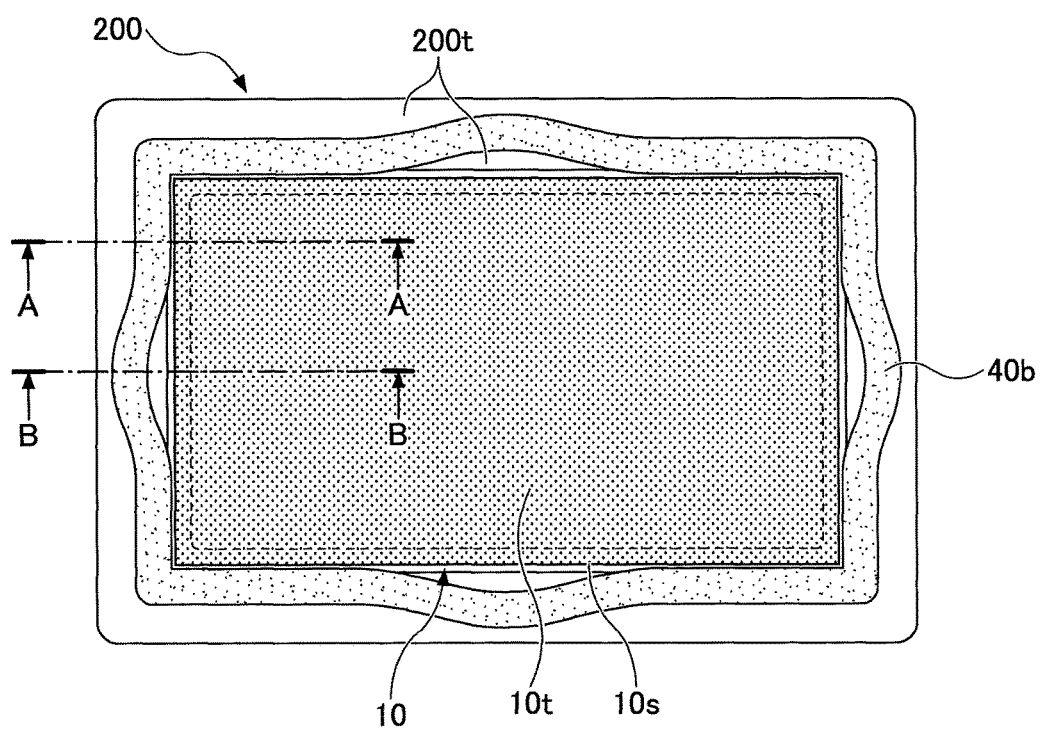
FIGS. 9A through 9C are drawings illustrating the method of sealing a frame according to the comparative example.
Figure 9B:
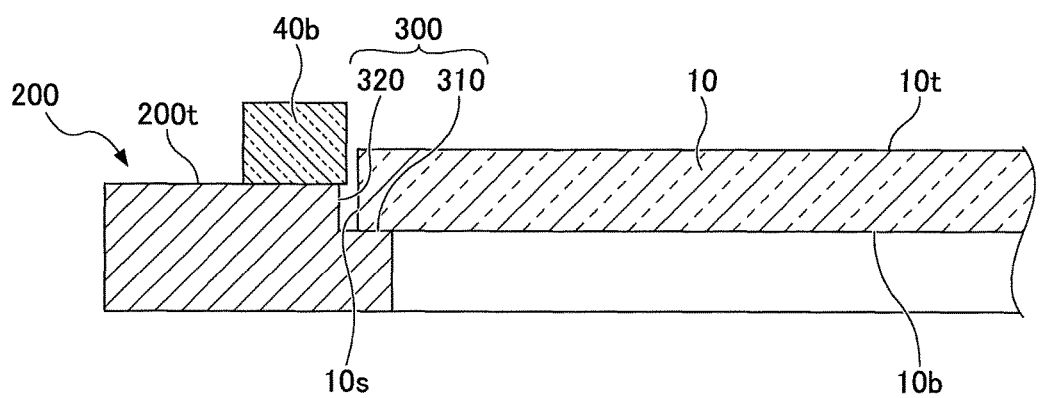
Figure 9C:
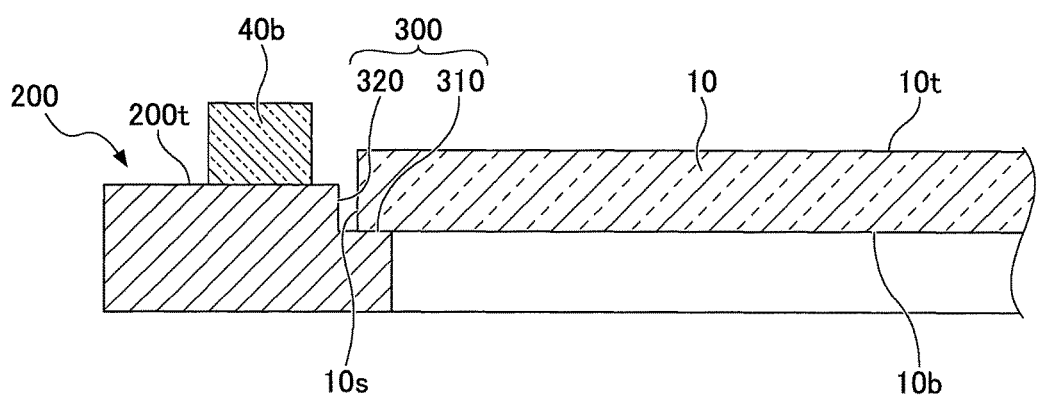

As illustrated in FIG. 9A, the same low melting glass 40*b* as the one shown in FIG. 5 is prepared, and is placed on the frame 200 having the glass plate 10 seated thereon (see FIG. 8B). FIG. 9A is a plan view. FIG. 9B is a partial cross-sectional view taken along a line A-A in FIG. 9A. FIG. 9C is a partial cross-sectional view taken along a line B-B in FIG. 9A. Each inner side and each outer side of the low melting glass 40*b* has an outwardly bulging center area, so that a gap between the low melting glass 40*b* and the peripheral side surface 10*s* of the glass plate 10 increases around the center area of each inner side and each outer side. Because of this, the center area of each inner side of the low melting glass 40*b* does not reach the position of the step 300.

Figure 10A:
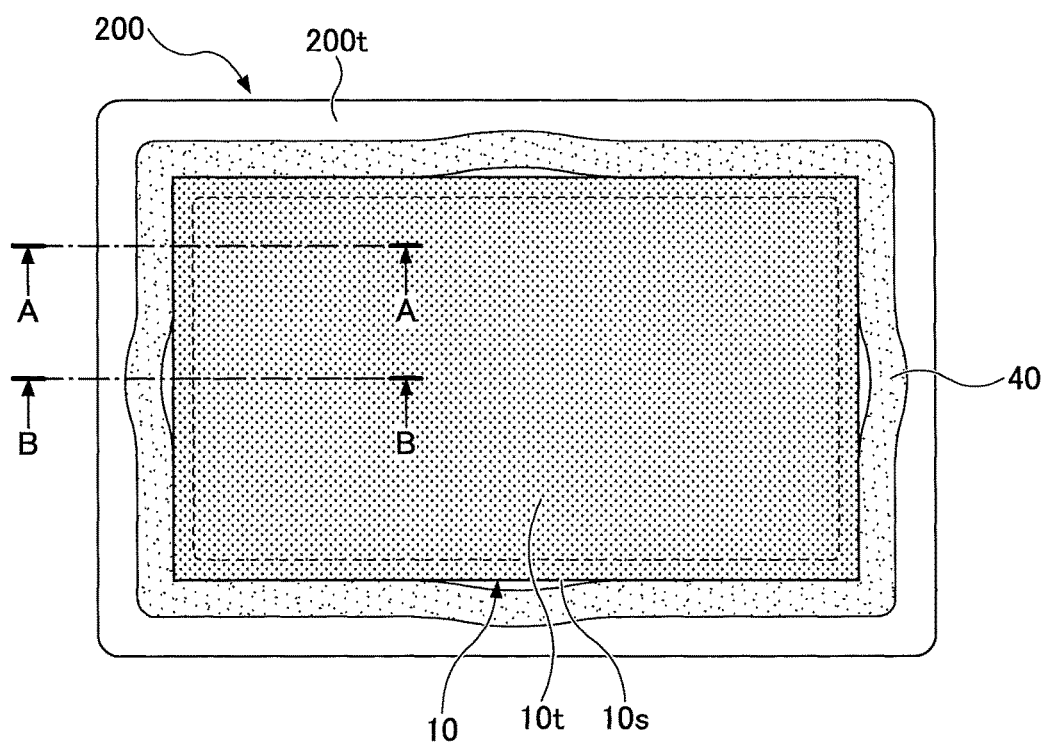
FIGS. 10A through 10C are drawings illustrating the method of sealing a frame according to the comparative example.
Figure 10B:
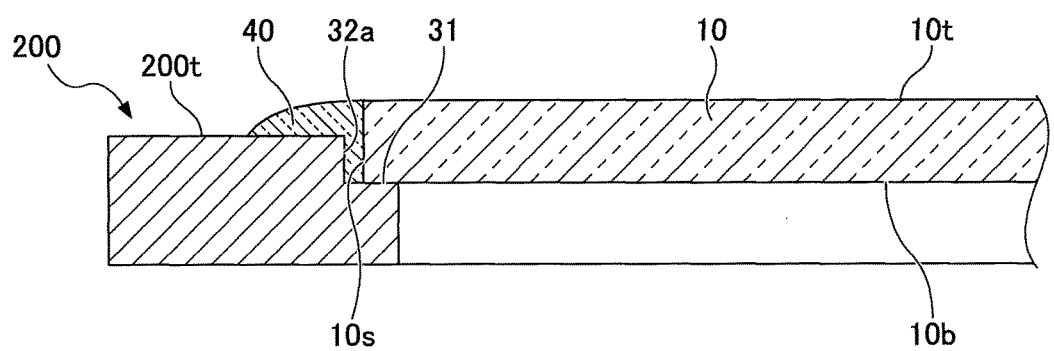
Figure 10C:
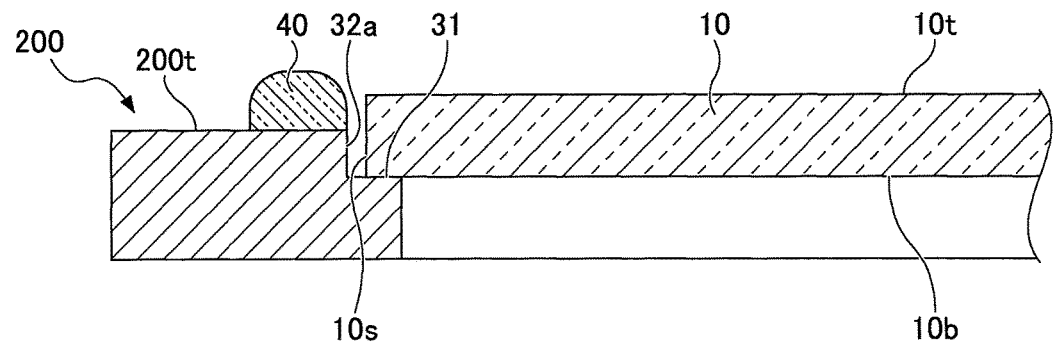

As illustrated in FIGS. 10A through 10C, the low melting glass 40*b* is melted at or above a predetermined temperature and then cured, so that the glass plate 10 is sealed to the frame 200. The cured glass is referred to as the low melting glass 40. FIG. 10A is a plan view. FIG. 10B is a partial cross-sectional view taken along a line A-A in FIG. 10A. FIG. 10O is a partial cross-sectional view taken along a line B-B in FIG. 10A.

As is illustrated in FIGS. 9A through 9C, the center area of each inner side and each outer side of the low melting glass 40*b* bulges outwardly, so that the center area of each inner side of the low melting glass 40*b* does not reach the position of the step 300. Because of this, the melted mass of the low melting glass 40*b* does not readily flow toward the peripheral side surface 10*s* at the center area of each inner side and each outer side of the low melting glass 40*b*. A likely resulting condition is that the peripheral side surface 10*s* of the glass plate 10 is not wetted (as illustrated in FIG. 10O), or only partly wetted, by the low melting glass 40 at the center area of each inner side and each outer side of the low melting glass 40*b*. It is thus difficult to reliably seal the entire peripheral side surface 10*s* of the glass plate 10.

In contrast, the frame 20 of the light emitter cover 1 has the second wall face 32*b*, at the position corresponding to the bulges of the low melting glass 40*b*, extending at an inclination angle greater than or equal to the minimum angle at which the melted mass of the low melting glass 40*b* starts sliding on its own weight. As illustrated in FIG. 7C, therefore, the melted liquid mass of the low melting glass 40*b* flows on the second wall face 32*b* toward the peripheral side surface 10*s* of the glass plate 10, resulting in being cured while being in contact with the peripheral side surface 10*s*. With this arrangement, the entire peripheral side surface 10*s* of the glass plate 10 is reliably sealed with the low melting glass 40, which improves sealing reliability between the glass plate 10 and the frame 20.

If there is a gap between the low melting glass 40 and part of the peripheral side surface 10*s* of the glass plate 10 as a result of a failure to seal the entire peripheral side surface 10*s* of the glass plate 10 with the low melting glass 40, there is a risk that a crack starts from the gap and develops in the low melting glass 40 upon thermal impact. Securely sealing the entire peripheral side surface 10*s* of the glass plate 10 with the low melting glass 40 can prevent a crack from developing in the low melting glass 40 upon thermal impact. It may be noted that thermal impact may occur when the light emitter cover 1 is placed in the environment in which the temperature frequently alternates between a high temperature and a low temperature, for example.

Lead-free low melting glass has poor wettability unlike low melting glass containing lead. Because of this, the use of the tilted second wall face 32*b* is advantageous especially when lead-free low melting glass is used as a seal between the glass plate 10 and the frame 20.

A method of applying a large quantity of low melting glass to seal a glass plate to a frame is not used for the light emitter cover 1, which facilitates the size reduction of the light emitter cover 1.

The first wall faces 32*a* extend perpendicularly to the placement face 31. At the positions of the first wall faces 32*a*, however, the low melting glass 40*b* have no bulges or only minute bulges, so that a gap between the low melting glass 40b and the peripheral side surface 10s of the glass plate 10 is small. At these positions, therefore, the entire peripheral side surface 10s of the glass plate 10 is reliably sealed even in the absence of inclined faces such as the second wall face 32b. Notwithstanding this, the first wall faces 32a may be provided as inclined faces at the inclination angle θ similarly to the second wall face 32b. Namely, the entire wall faces 32 may be provided as inclined faces at the inclination angle θ. With such an arrangement, aligning the glass plate 10 with respect to the frame 20 becomes more difficult. A dedicated tool for alignment, for example, may be made to cope with this issue.

Use of the first wall faces 32a extending perpendicularly to the placement face 31 is advantageous from the viewpoint of alignment of the glass plate 10 relative to the frame 20, and is also advantageous when considering the tilt of the glass plate 10 relative to the placement face 31. Namely, the perimeter of the lower face 10b of the glass plate 10 is prevented from climbing over the inclined second wall face 32b.

First Variation of First Embodiment

The first variation of the first embodiment is directed to an example of a light emitter cover with a step having a different shape than the first embodiment. In connection with the first variation of the first embodiment, a description of the same or similar constituent elements as those of the previously provided descriptions may be omitted as appropriate.

Figure 11:
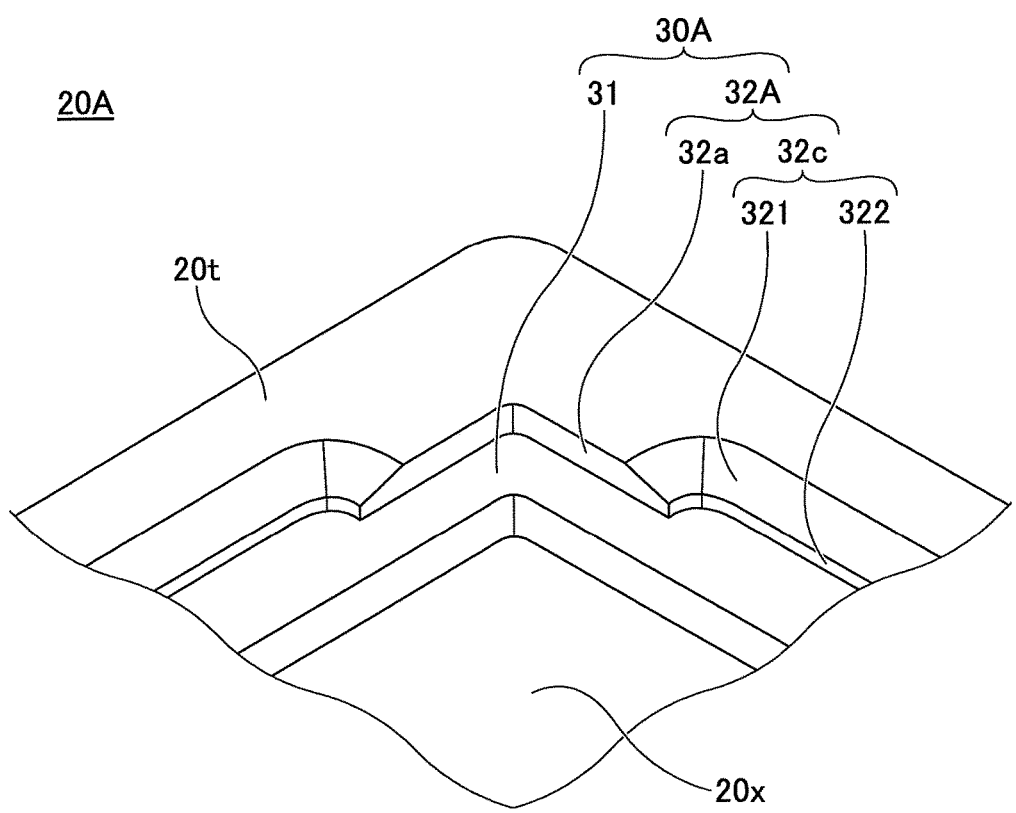
FIG. 11 is an axonometric partial view illustrating an example of a frame of a light emitter cover according to a first variation of the first embodiment.
Figure 12A:
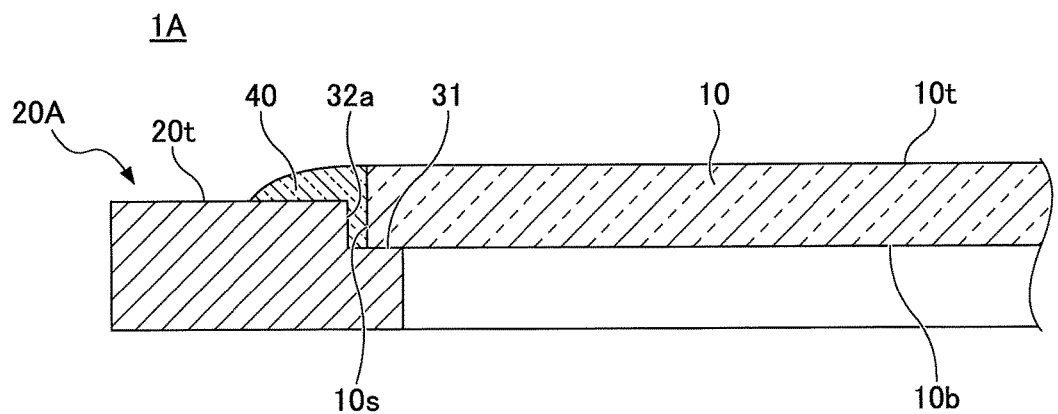
FIGS. 12A and 12B are cross-sectional partial views illustrating the example of the frame of a light emitter cover according to the first variation of the first embodiment.
Figure 12B:
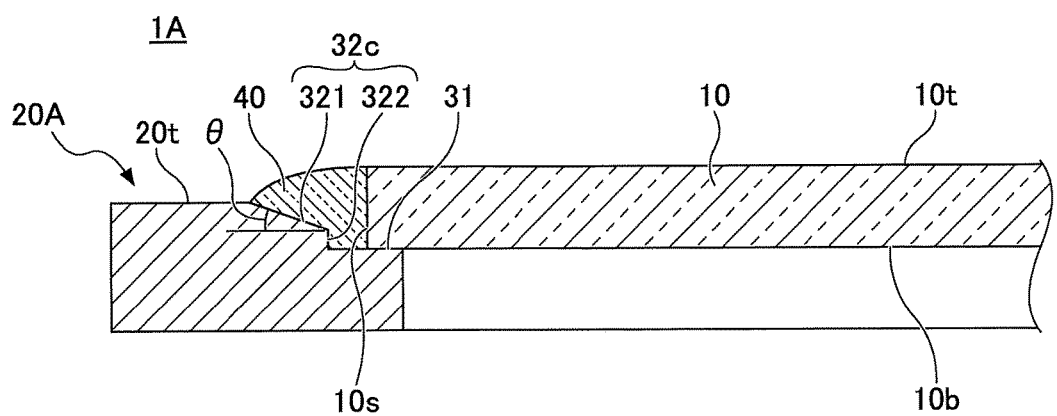

FIG. 11 is an axonometric partial view of the frame of a light emitter cover according to the first variation of the first embodiment. FIG. 11 illustrates the portion corresponding to FIG. 3B. FIGS. 12A and 12B are partial cross-sectional views of the light emitter cover according to the first variation of the first embodiment. FIGS. 12A and 12B illustrate cross-sections corresponding to FIG. 1B and FIG. 10, respectively.

As illustrated in FIG. 11 and FIGS. 12A and 12B, a light emitter cover 1A according to the first variation of the first embodiment differs from the light emitter cover 1 (see FIGS. 1A through 1C to FIGS. 3A and 3B) in that a frame 20A replaces the frame 20.

Similarly to the frame 20, the frame 20A is a metal member having the opening 20x smaller than the glass plate 10, and may be a picture frame shape, for example. The metal that forms the frame 20A may be an alloy of nickel and iron, for example. The surface of the frame 20A may have a surface treatment, such as plating, applied thereto.

The frame 20A has an encircling (i.e., ring-shaped) step 30A formed on the side toward the opening 20x. The step 30A includes a placement face 31 and wall faces 32A. The placement face 31 is the same as that of the frame 20. The wall faces 32A are portions connecting the placement face 31 to the upper face 20t of the frame 20A. The wall faces 32A include first wall faces 32a situated near the opposite ends of each of the four inner sides of the encircling step 30A, and include a second wall face 32c situated between the first wall faces 32a. The second wall face 32c includes a first face 321 situated toward the upper face 20t of the frame 20A and a second face 322 situated between the first face 321 and the placement face 31.

The first face 321 extends at an inclination angle smaller than the first wall faces 32a with respect to the placement face 31. The first face 321 is tilted with respect to the placement face 31 such that the distance between the first face 321 and the peripheral side surface 10s of the glass plate 10 increases toward the upper face 20t of the frame 20A. The inclination angle θ is set greater than or equal to the minimum angle at which the melted mass of the low melting glass 40 starts sliding on its own weight. The inclination angle θ may be approximately 30 to 60 degrees, for example.

The second face 322 has an inclination angle steeper than the first face 321 with respect to the placement face 31. The second face 322 may extend perpendicularly to the placement face 31, for example. A minute gap (i.e., clearance) is formed between the second face 322 and the peripheral side surface 10s of the glass plate 10. The gap between the second face 322 and the peripheral side surface 10s of the glass plate 10 may be approximately 100 micrometers, for example.

The frame 20A of the light emitter cover 1A has the first face 321 of the second wall face 32c, at the position corresponding to the bulges of the low melting glass 40b (see FIG. 5, for example), extending at an inclination angle greater than or equal to the minimum angle at which the melted mass of the low melting glass 40b starts sliding on its own weight. As illustrated in FIGS. 12A and 12B, therefore, the melted liquid mass of the low melting glass 40b flows on the first face 321 toward the peripheral side surface 10s of the glass plate 10, resulting in being cured while being in contact with the peripheral side surface 10s. With this arrangement, the entire peripheral side surface 10s of the glass plate 10 is reliably sealed.

With respect to the second wall face 32c, provision of the second face 322 as a vertical wall, for example, on the side of the first face 321 toward the placement face 31 allows the glass plate 10 to be more readily aligned in the opening 20x of the frame 20A.

Further, although the preferred embodiments have been described, the present invention is not limited to these embodiments, and various variations and modifications may be made without departing from the scope of the present invention.

For example, the plane shape of the glass plate does not have to be rectangular, and may alternatively be a hexagonal shape, for example.

According to at least one embodiment, a cover for a light emitter is provided that has an improved sealing reliability between a glass plate and a frame while facilitating size reduction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A cover for a light emitter having one or more light emitting devices, comprising:
   a glass plate having an upper face, a lower face, and a peripheral side surface;
   a frame made of metal having an opening smaller than the glass plate; and
   a low melting glass having a lower melting point than the glass plate, the glass plate being sealed to the frame with the low melting glass to close the opening, wherein the frame has an encircling step formed on a side thereof to which the glass plate is sealed, wherein the encircling step includes:

a placement face situated at a recessed position relative to an upper surface of the frame, the placement face being in contact with a perimeter of the lower face of the glass plate to have the glass plate placed thereon; and a wall face connecting the upper surface of the frame and the placement face, wherein the wall face includes first wall faces situated at opposite ends of each inner side of the encircling step and a second wall face situated between the first wall faces, and the second wall face includes a face extending at a smaller inclination angle than the first wall faces with respect to the placement face, and wherein gaps between the first wall faces and the peripheral side surface of the glass plate and a gap between the second wall face and the peripheral side surface of the glass plate are filled with the low melting glass.

2. The cover as claimed in claim 1, wherein the placement face includes a flat surface extending substantially parallel to the upper surface of the frame.

3. The cover as claimed in claim 1, wherein the second wall face extends an equal length toward the opposite ends from a center of each inner side of the encircling step.

4. The cover as claimed in claim 1, wherein the first wall faces extend perpendicularly to the placement face.

5. The cover as claimed in claim 1, wherein the second wall face includes a first face situated toward the upper surface of the frame and a second face situated between the first face and the placement face, and the first face is the face extending at the smaller inclination angle than the first wall faces with respect to the placement face, the second face extending at a steeper inclination angle than the first face with respect to the placement face.

6. The cover as claimed in claim 1, wherein the smaller inclination angle of the second wall face is greater than or equal to a minimum angle at which a melted mass of the low melting glass starts sliding on own weight.

7. The cover as claimed in claim 1, wherein the upper face of the glass plate is situated above the upper surface of the frame, and a portion of the peripheral side surface of the glass plate situated above the upper surface of the frame is covered with the low melting glass.

8. The cover as claimed in claim 1, wherein the low melting glass contains no lead.

\* \* \* \* \*